(12) United States Patent
Huang et al.

(10) Patent No.: US 9,865,676 B2
(45) Date of Patent: Jan. 9, 2018

(54) POWER SEMICONDUCTOR DEVICE (71) Applicant: Macroblock, Inc., Hsinchu (TW)

(72) Inventors: Chih-Fang Huang, Hsinchu (TW);
Kung-Yen Lee, Hsinchu (TW);
Chia-Hui Cheng, Hsinchu (TW);
Sheng-Zhong Wang, Hsinchu (TW)

(73) Assignee: MACROBLOCK, INC., Hsinchu (TW)

( * ) Notice: Subject to any disclaimer, the term of this patent is extended or adjusted under 35 U.S.C. 154(b) by 0 days.

(21) Appl. No.: 15/359,209

(22) Filed: Nov. 22, 2016

(65) Prior Publication Data
US 2017/0148870 A1 May 25, 2017

(30) Foreign Application Priority Data

Nov. 24, 2015 (TW) .............................. 104138971 A (51) Int. Cl.
*H01L 29/02* (2006.01)
*H01L 29/06* (2006.01)
*H01L 29/36* (2006.01)
*H01L 29/423* (2006.01)
*H01L 29/78* (2006.01)
H01L 29/08 (2006.01)

(52) U.S. Cl.
CPC ........ *H01L 29/0619* (2013.01); *H01L 29/063* (2013.01); *H01L 29/0615* (2013.01); *H01L 29/36* (2013.01); *H01L 29/42356* (2013.01); *H01L 29/7811* (2013.01); *H01L 29/7827* (2013.01); *H01L 29/0878* (2013.01)

(58) Field of Classification Search
CPC ............. H01L 29/0615; H01L 29/0634; H01L 29/6609; H01L 29/0619; H01L 29/861

USPC ......................................................... 257/487
See application file for complete search history.

(56) References Cited

U.S. PATENT DOCUMENTS

| 2003/0222327 | A1 | 12/2003 | Yamaguchi et al. |
| 2005/0029584 | A1 | 2/2005 | Shiraishi |
| 2007/0138543 | A1* | 6/2007 | Saito .................... H01L 29/0634 257/328 |
| 2008/0179671 | A1* | 7/2008 | Saito .................... H01L 29/0634 257/341 |
| 2012/0199900 | A1 | 8/2012 | Oosawa et al. |
| 2013/0181280 | A1 | 7/2013 | Sdrulla et al. |
| 2014/0197477 | A1* | 7/2014 | Onishi ................ H01L 29/7811 257/329 |

FOREIGN PATENT DOCUMENTS

JP  2008-103529 A  5/2008

* cited by examiner

*Primary Examiner* — Trung Q Dang
(74) *Attorney, Agent, or Firm* — DLA Piper LLP (US)

(57) ABSTRACT

A power semiconductor device includes a substrate, a main body, and an electrode unit. The main body includes an active portion disposed on the substrate, an edge termination portion, and an insulating layer disposed on the edge termination portion. The edge termination portion includes first-type semiconductor region, a second-type semiconductor region and a top surface. The first-type semiconductor region is adjacent to the active portion and has a first-type doping concentration decreased from the top surface toward the substrate. The electrode unit includes a first electrode disposed on the insulating layer, and a second electrode disposed on the substrate.

18 Claims, 9 Drawing Sheets

FIG.9

POWER SEMICONDUCTOR DEVICE

CROSS-REFERENCE TO RELATED APPLICATION

This application claims priority of Taiwanese Invention Patent Application No. 104138971, filed on Nov. 24, 2015.

FIELD

The disclosure relates to a power semiconductor device, and more particularly to a power semiconductor device including an edge termination portion with a doping gradient.

BACKGROUND

A conventional power semiconductor device includes an active portion and an edge termination portion that surrounds the active portion. The edge termination portion can contribute to removal of undesired leakage current, undesired electric field crowding, or accumulated electrostatic charges in the active portion, and withstanding of high reverse voltages.

The active portion mainly includes a plurality of transistors or rectifiers that are electrically connected in parallel. More specifically, the transistors are formed with a plurality of gates, wells, and alternately arranged n-type and p-type semiconductor pillars. The edge termination portion typically includes alternate n-type and p-type semiconductor pillars like the active portion. A pitch between two adjacent ones of the p-type and n-type semiconductor pillars of the edge termination portion has to be precisely controlled. When the pitch is too large, the breakdown voltage of the edge termination portion is smaller than that of the active portion. Then the edge termination portion would fail to withstand the breakdown voltage of the power semiconductor device, and would be likely to break down prior to the active portion breaking down. When the pitch is too small, the depletion region between two adjacent ones of the p-type and n-type semiconductor pillars of the edge termination portion cannot be enlarged to withstand a relatively high breakdown voltage.

Another edge termination portion is fabricated in a diode structure that is formed very closely to the top surface by extension of a junction between a p-type semiconductor layer and an n-type semiconductor layer of the active region. When doping concentrations of the n-type and p-type semiconductor layers are reduced to increase a depletion region between the n-type and p-type semiconductor layers, the electric field strength is reduced. Hence, the edge termination portion is able to withstand a high reverse voltage. When the doping concentrations of the n-type and p-type semiconductor layers of the conventional edge termination portion are increased, the electric field intensity is increased thereby, whereas the depletion region is decreased and the electric force lines are unevenly distributed at the edge termination portion. Thus, the edge termination portion can only withstand a relatively low breakdown voltage. Furthermore, a depth of the junction measured from the top is relatively small and a relatively large area is needed for the optimal design of the edge termination portion, which requires that the chip size be relatively large.

SUMMARY

Therefore, an object of the disclosure is to provide a power semiconductor device that can alleviate at least one of the drawbacks of the prior art.

The power semiconductor device includes a substrate, a main body, and an electrode unit.

The main body includes an active portion that is disposed on the substrate, an edge termination portion that is disposed on the substrate and that surrounds the active portion, and an insulating layer that is disposed on the edge termination portion and spaced apart from the substrate. The edge termination portion includes a first-type semiconductor region, a second-type semiconductor region, and a top surface that is formed on top of the first-type and second-type semiconductor regions and that underlies the insulating layer. The first-type semiconductor region is disposed adjacent to the active portion, and has a first-type doping concentration that is decreased from the top surface toward the substrate. The first-type semiconductor region and the second-type semiconductor region cooperatively form a junction.

The electrode unit includes a first electrode that is disposed on the insulating layer and that is electrically coupled to the active region, and a second electrode that is disposed on the substrate and that is spaced apart from the main body.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
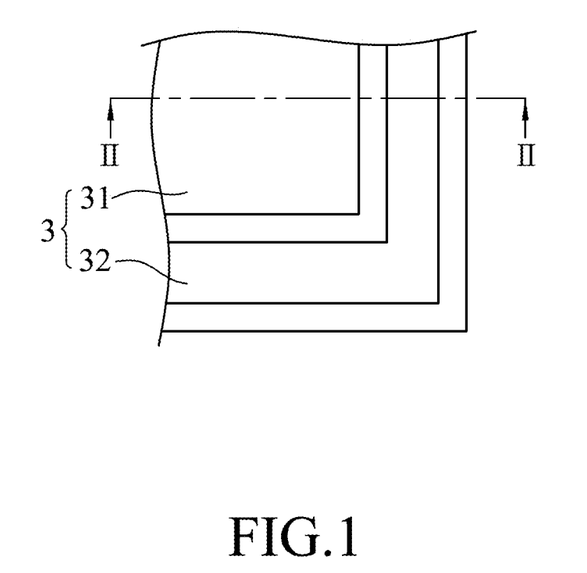
FIG. 1 is a fragmentary top view illustrating a part of an active portion and a part of a terminal portion of an embodiment of a power semiconductor device according to the disclosure.
Figure 2:
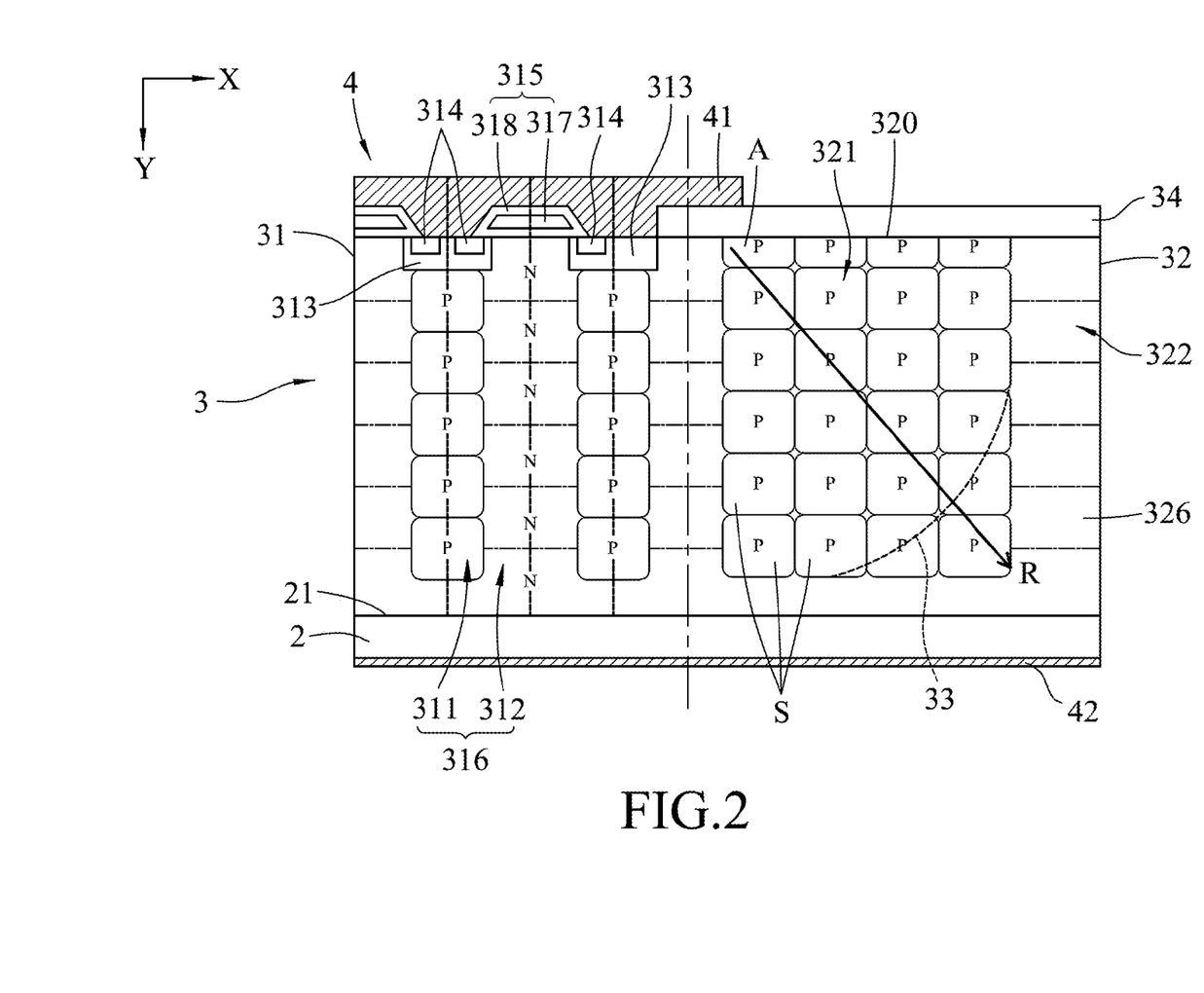
FIG. 2 is a schematic cross-sectional view taken along line II-II of FIG. 1.

Referring to FIGS. 1 and 2, an embodiment of a power semiconductor device according to the disclosure includes a substrate 2, a main body 3, and an electrode unit 4.

The substrate 2 is made of a semiconductor material and has a top surface 21. In the embodiment, the substrate 2 is exemplified to be made of an n-type semiconductor material.

The main body 3 includes an active portion 31 that is disposed on the substrate 2, an edge termination portion 32 that is disposed on the substrate 2 and that surrounds the active portion 31, and an insulating layer 34 that is disposed on the edge termination portion 32 and spaced apart from the substrate 2.

The active portion 31 includes a plurality of transistors 316 that are electrically interconnected in parallel. Each of the transistors 316 has a super junction. More specifically, the active portion 31 includes a plurality of alternately arranged first-type and second-type semiconductor pillar-shaped regions 311, 312, a plurality of well regions 313, each of which is formed on a respective one of the first-type semiconductor pillar-shaped regions 311 and indented from a top surface of the active portion 31 toward the substrate 2, a plurality of source regions 314, each two of which are formed in a respective one of the well regions 313 in a spaced apart manner and proximal to the top surface of the active portion 31, and a plurality of gate regions 315 that are respectively disposed on top of the second-type semiconductor pillar-shaped regions 312 and connected to the source regions 314 so as to form the transistors 316. Each of the gate regions 315 includes a gate electrode 317 and a gate insulating layer 318 separating the gate electrode 317 from the first-type and second-type semiconductor. It is worth noting that the transistors 316 may be power transistors, such as super junction transistors, or normal transistors. The configuration of each of the transistors is not of the essence of the present disclosure, and is well known to those skilled in the art. Thus, further details thereof are not provided herein for the sake of brevity.

The edge termination portion 32 includes a first-type semiconductor region 321, a second-type semiconductor region 322, and a top surface 320 that is formed on top of said first-type and second-type semiconductor regions 321, 322 and that underlies the insulating layer 34. The first-type semiconductor region 321 is disposed adjacent to the active portion 31. More specifically, the first-type semiconductor region 321 extends from the top surface 320 of the edge termination portion 32 toward the substrate 2 and surrounds the active portion 31. The second-type semiconductor region 322 extends from the top surface 21 of the substrate 2 to the top surface 320 of the edge termination portion 32 and surrounds the first-type semiconductor region 321. The first-type semiconductor region 321 and the second-type semiconductor region 322 cooperatively form a junction that will be explained hereinafter.

The electrode unit 4 includes a first electrode 41 that is disposed on the insulating layer 34 and that is electrically coupled to the active portion 31, and a second electrode 42 that is disposed on the substrate 2 and that is spaced apart from the main body 3. In the embodiment, the first electrode 41 is electrically connected to the source regions 314 of the active portion 31, and is partly formed on the insulating layer 34 so as to be coupled to the edge termination portion 32.

Generally, the first-type semiconductor region 321 has a first-type doping concentration that is decreased from the top surface 320 toward the substrate 2. In the embodiment, the first-type doping concentration of the first-type semiconductor region 321 is decreased along radial directions (only one radial direction is shown by arrow (R) in FIG. 2) from a part (A) of the edge termination portion 32, which is proximal to the active portion 31 and the top surface 320 of the edge termination portion 32, toward the substrate 2 and an outer peripheral surface 326 of the edge termination portion 32. The term "radial directions" used herein refers to different radial directions that are centered at a point in the part (A) shown in FIG. 2. In the embodiment, the first-type is p-type, and the second-type is n-type. The first-type semiconductor region 321 is a p-type semiconductor region including group III atoms as majority carriers, and the second-type semiconductor region 322 is an n-type semiconductor region including group V atoms as majority carriers. However, dopants for the first-type and second-type semiconductor regions 321, 322 should not be limited in the disclosure.

Specifically, in one example of the embodiment, the edge termination portion 32 is made by epitaxially forming multiple n-type semiconductor layers on the substrate 2, and doping the n-type semiconductor layers to form the first-type (p-type) semiconductor region 321. In FIG. 2, the symbol "P" in the edge termination portion 32 refers to a p-type dopant used in forming the first-type semiconductor region 321, and square blocks bearing the symbol "P" represent semiconductor segments (S) of the first-type (p-type) semiconductor region 321 having different p-type doping concentrations. The p-type doping concentration of the first-type semiconductor region 321 is decreased along a first direction (Y) that extends from the top surface 320 of the edge termination portion 32 to the substrate 2 and that is perpendicular to the substrate 2, and a second direction (X) that extends from the active portion 31 toward an outer peripheral surface 326 of the edge termination portion 32 and that is parallel to the substrate 2. In the embodiment, the first-type semiconductor region 321 is formed by implanting ions into multiple epitaxial layers in cooperation with adjustment of opening rates of photomasks. The concentration of the ions added to the epitaxial layers is varied along the first direction (Y) through adjustment of concentrations of the dopants. The passage of the ions is controlled by adjustment of opening rates of photomasks so as to vary the ion concentration along the second direction (X). Accordingly, the concentration of the ions is decreased radially along the first and second directions (Y) and (X) and oblique directions that are oblique to the substrate 2 as shown FIG. 2. While the ion implantation method is used in the embodiment, other methods may also be used for forming the first-type semiconductor region 321.

Referring back to FIG. 2, the semiconductor segment (S) furthest from the top surface 320 of the edge termination portion 32 and the active portion 31 has the lowest p-type doping concentration so that the majority carriers in the furthest semiconductor segment (S) from the top surface 320 of the edge termination portion 32 and the active portion 31 are n-type carriers (determined from a total of n-type carriers and p-type carriers). Accordingly, the semiconductor segments (S) distal from the top surface 320 of the edge termination portion 32 and the active portion 31 have n-type semiconductor characteristics, and the semiconductor segments (S) proximal to the top surface 320 of the edge termination portion 32 and the active portion 31 have p-type semiconductor characteristics.

When a voltage is applied to the power semiconductor device of the disclosure, a depletion region is formed along a line 33 shown in FIG. 2, where the junction between the first-type and second-type semiconductor regions 321, 322 exists.

Alternatively, the active region may include a plurality of rectifiers (not shown) instead of the transistors. The rectifiers are electrically connected in parallel, and the first electrode 41 of the electrode unit 4 is coupled to the rectifiers.

Referring once again to FIG. 2, the first-type semiconductor region 321 of the edge termination portion 32 includes vertical and horizontal rows of the semiconductor segments (S). In particular, the first-type semiconductor region 321 may include N rows of the semiconductor segments (S) that are aligned in the second direction (X), where N is a number greater than 1. Each two adjacent ones of the semiconductor segments (S) in the N rows may have a first-type doping concentration difference less than 50% based on a first-type doping concentration of one of the two adjacent ones of the semiconductor segments (S) in the N rows.

In addition, the first-type semiconductor region 321 of the edge termination portion 32 may include M rows of the semiconductor segments (S) that are aligned in the first direction (Y), where M is a number greater than 1. Each two adjacent ones of the semiconductor segments (S) in the M rows may have a first-type doping concentration difference less than 50% based on a first-type doping concentration of one of the two adjacent ones of the semiconductor segments (S) in the M rows.

The N rows of the p-type semiconductor segments (P) are connected to each other, and the M rows of the p-type semiconductor segments (P) are connected to each other, or disconnected from each other.

Figure 3:
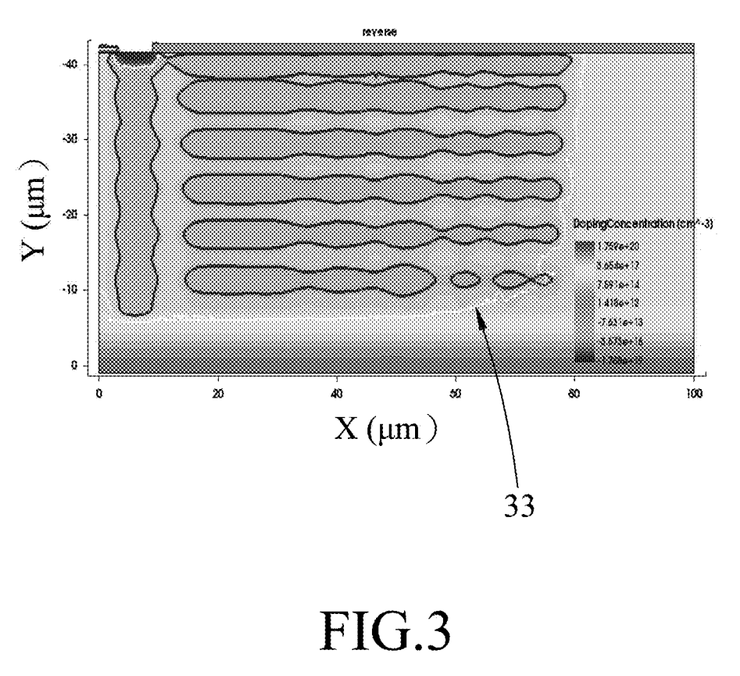
FIG. 3 is a semiconductor process simulation image illustrating an edge termination portion of FIG. 2.

FIG. 3 shows a semiconductor process simulation image that illustrates p-type doping concentration distributions in the edge termination portion 32 of the embodiment, and that is obtained from a computer simulation using the embodiment and a Technology Computer Aided Design (TCAD). The function of the edge termination portion 32 that is coupled to the active portion 31 is to direct excessive electric charges to an external site so as to avoid breakdown of the active portion 31. When positive voltages are applied between the substrate 2 (serves as the drain terminal of the transistors 316) and the source regions 314 and between the gate regions 315 and the source regions 314, the transistors 316 are turned ON. FIG. 3 shows that, since the first-type doping concentration of the first-type semiconductor region 321 of the edge termination portion 32 is decreased from the top surface 320 toward the substrate 2, the depletion region may be extended or enlarged by applying an external drain voltage.

Figure 4:
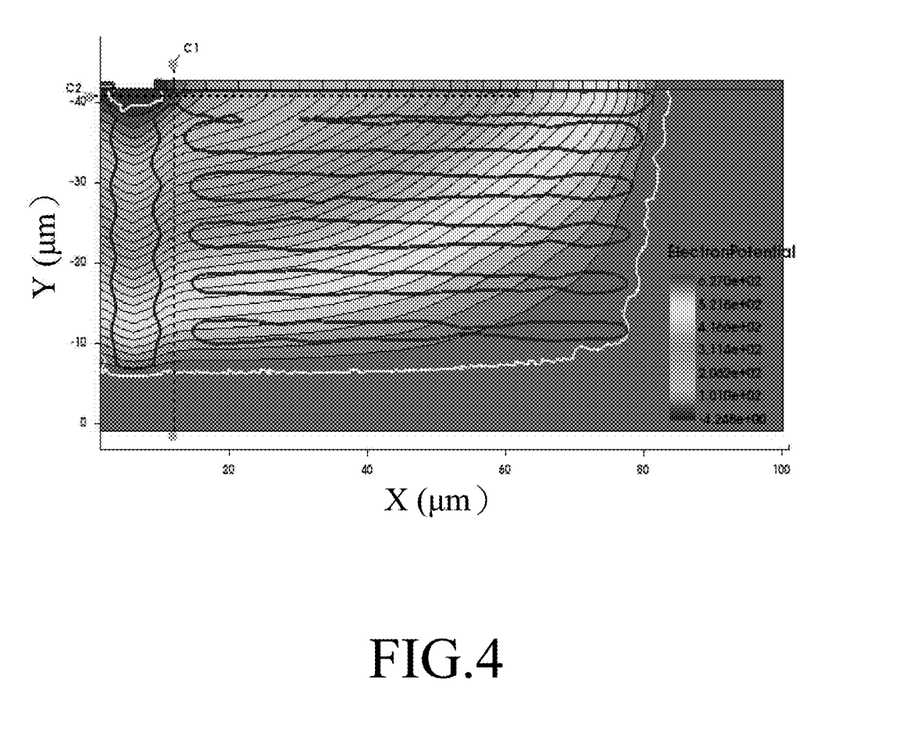
FIG. 4 is a semiconductor process simulation image illustrating electric force lines in the edge termination portion of FIG. 2.

FIG. 4 is a semiconductor process simulation image that illustrates electric lines of force generated in the edge termination portion 32 of the embodiment and that is obtained from a computer simulation using a Technology Computer-Aided Design (TCAD). The semiconductor process simulation image shows that, because the p-type doping concentration decreases from the active portion 31 to the cuter peripheral surface 326 of the edge termination portion 32 and from the top surface 320 to the substrate 2, extension of electric lines of force is facilitated. By virtue of this effect, the size of the edge termination portion 32 can be reduced. In contrast to the embodiment, the doping concentrations in the first-type and second-type semiconductor regions of the edge termination portion of the conventional power semiconductor device are fixed, and the volume of the edge termination portion thereof has to be increased if it is desired to provide an increased resistance that can withstand a high breakdown voltage. By virtue of the varying first-type doping concentration in the embodiment, not only can the depletion region be extended along the line 33, but the size of the edge termination portion 32 can also be reduced while still being able to withstand a relatively high breakdown voltage.

The embodiment of the power semiconductor device according to the disclosure may be modified by decreasing the first-type doping concentration of the first-type semiconductor region only in a direction front the top surface 320 of the edge termination portion 32 toward the substrate 2. That is to say, the first-type doping concentration of the first-type semiconductor region 321 is decreased only along the first direction (Y).

Figure 5:
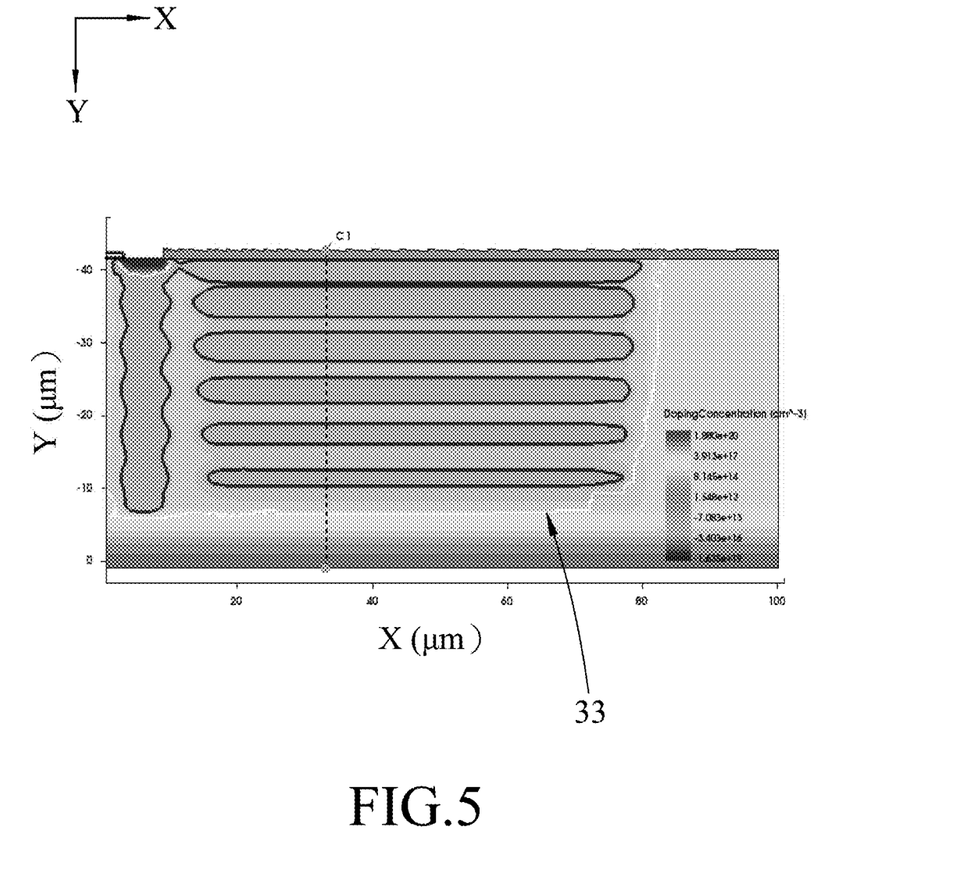
FIG. 5 is a semiconductor simulation image illustrating an edge termination portion of modification of the embodiment of FIG. 2.

FIG. 5 is a semiconductor process simulation image illustrating a p-type doping concentration distribution of the edge termination portion 32 of the abovementioned modification and obtained from a computer simulation using TCAD. The semiconductor process simulation image shows that the depletion region is also enlarged along the line 33.

Figure 6:
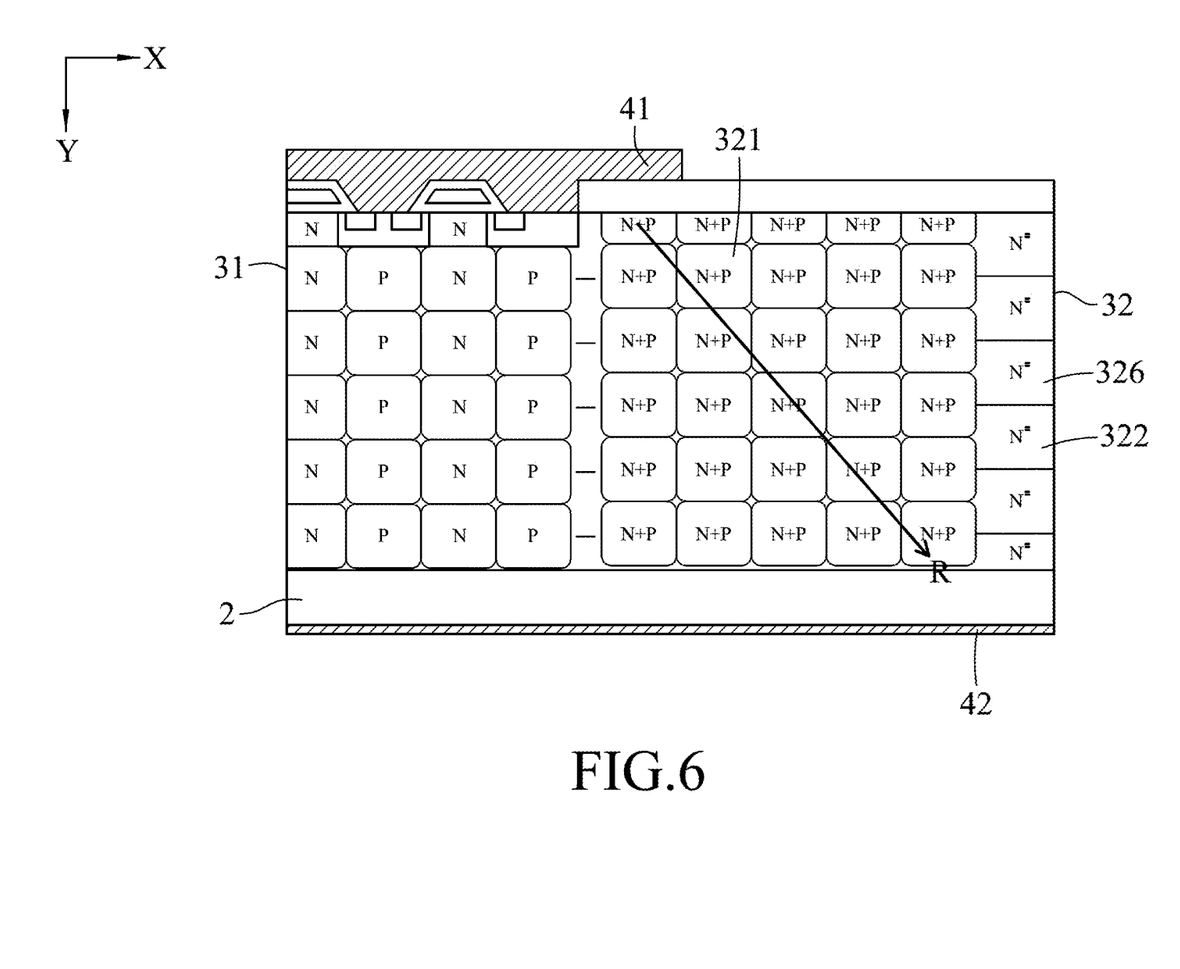
FIG. 6 is a schematic cross-sectional view illustrating another modification of the embodiment of FIG. 2.

Referring to FIG. 6, another modification of the first embodiment is illustrated. The edge termination is formed by employing an alternative method. Specifically, two types of doping elements are used to dope each of the epitaxial layers to form the first-type semiconductor region 321 and the second-type semiconductor region 322. The symbol "N+P" refers to a combination of N-type and p-type doping elements used in forming the first-type and second-type semiconductor regions 321, 322, and the square blocks bearing the symbol "N+P" represent semiconductor segments (S) having different doping concentrations. One of the two types of doping elements may be a group III element, and the other one of the two types of doping elements may be a group V element. The epitaxial layers are doped by varying the doping concentration of the group III element and the doping concentration of the group V element in such a manner that the doping concentration of the group III element is decreased along the first direction (Y) and the second direction (X), and the doping concentration of the group V element is increased along the first direction (Y) and the second direction (X). Accordingly, the first-type (p-type) doping concentration of the first-type semiconductor region 321 can be decreased along radial directions from a part (A) of the edge termination portion 32, which is proximal to the top surface 320 of the edge termination portion 32 and the active portion 31, toward the substrate 2 and an outer peripheral surface 326 of the edge termination portion 32. The second-type (n-type) doping concentration of the first-type semiconductor region 321 is increased along the first direction (Y) and the second direction (X).

Alternatively, the second-type doping concentration may be arranged to increase only along the first direction (Y).

Figure 7:
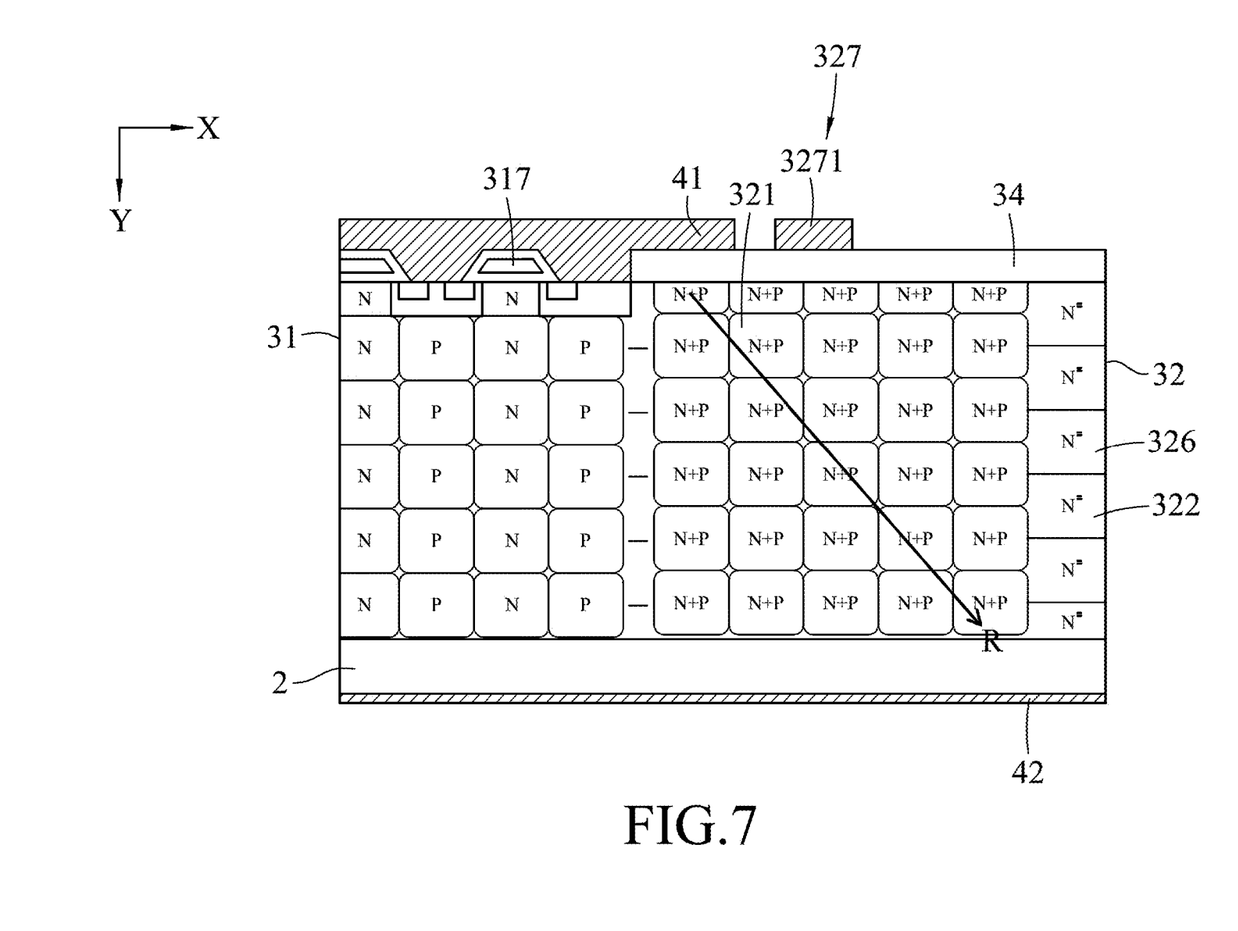
FIG. 7 is a schematic cross-sectional view illustrating still another modification of the embodiment of a power semiconductor device according to the disclosure.

Referring to FIG. 7, still another modification of the embodiment of the power semiconductor device according to the disclosure is illustrated. The edge termination portion 32 is exemplified to further include a guard-ring section 327. The guard-ring section 327 includes a guard-ring electrode 3271 that may be disposed on the insulating layer 34. The guard-ring electrode 3271 may be spaced apart from other electrodes so as to serve as a floating electrode. Alternatively, the guard-ring electrode 3271 may be connected to at least one of the first electrode 41, the second electrode 42 or the gate electrodes 317.

Figure 8:
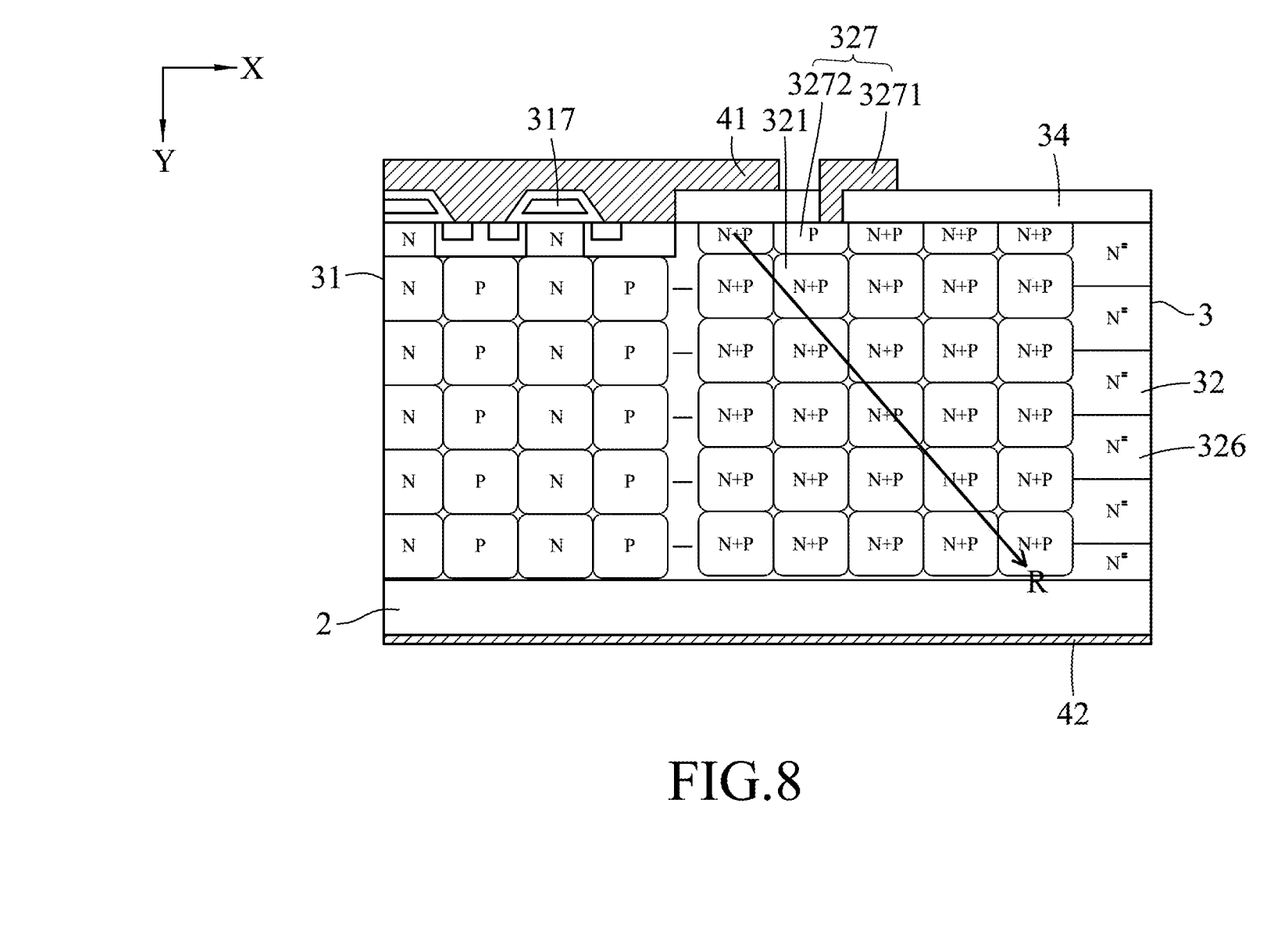
FIG. 8 is a schematic cross-sectional view illustrating yet another modification of the embodiment of FIG. 7.

Referring to FIG. 8, the guard-ring section 327 shown in FIG. 7 may further include a guard-ring semiconductor part 3272 that is made of said second-type semiconductor material and that is formed on top of said first-type semiconductor region 321. The guard-ring electrode 3271 passes through the insulating layer 34 and contacts the guard-ring semiconductor part 3272. The guard-ring semiconductor part 3272 has a doping concentration ranging from $1 \times 10^{16}$ cm$^{-3}$ to $1 \times 10^{20}$ cm$^{-3}$.

Figure 9:
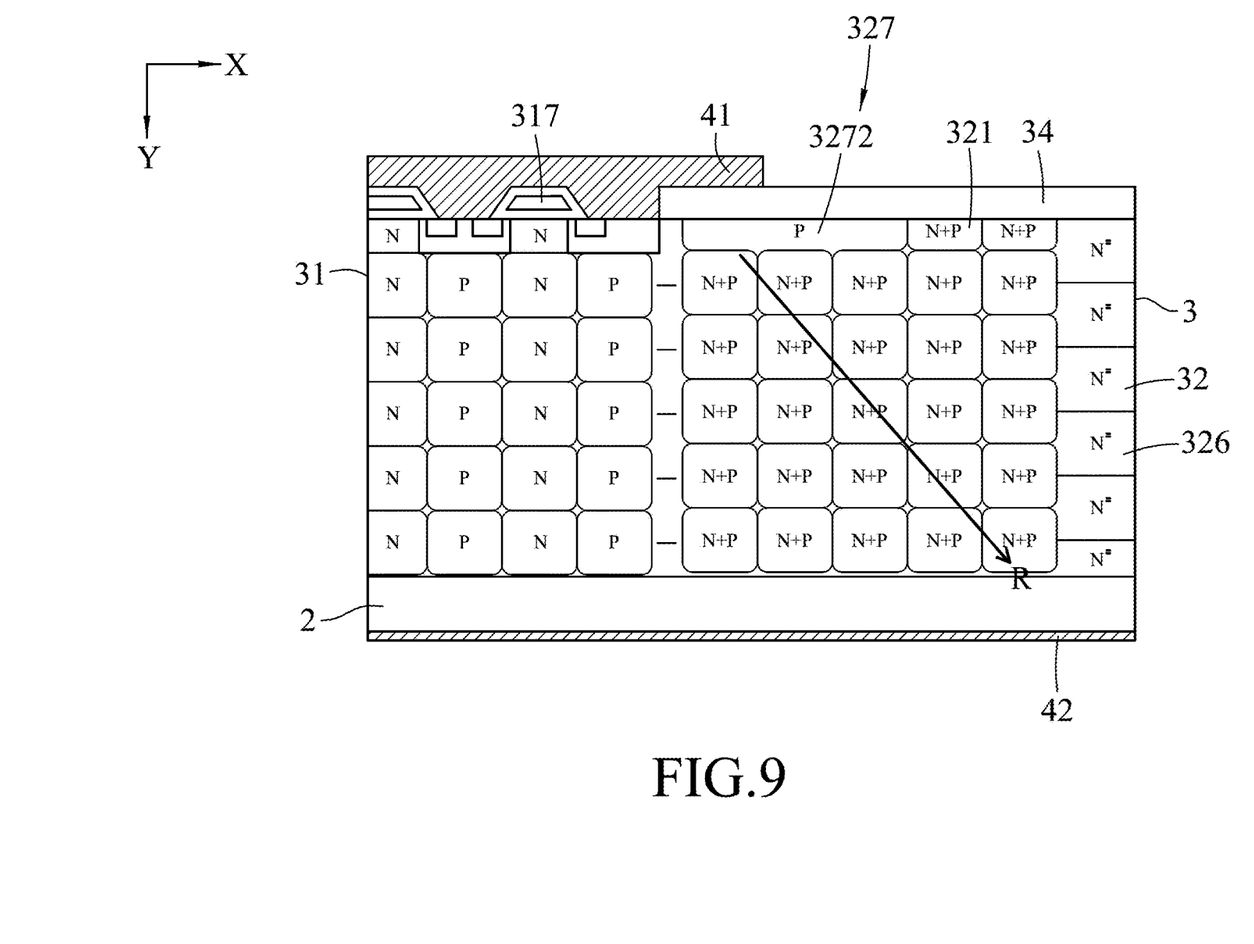
FIG. 9 is a schematic cross-sectional view illustrating still yet another modification of the embodiment of FIG. 7.

Referring to FIG. 9, still yet another modification of the embodiment of FIG. 7 is illustrated. The guard-ring semiconductor part 3272 formed on top of said first-type semiconductor region 321 is formed on the part of the edge termination portion 32 which is proximal to the active portion. The guard-ring semiconductor region 3272 has a predetermined doping concentration.

In summary, by virtue of the first-type doping concentration of the first-type semiconductor region 321 that is decreased in the direction (Y) particularly designed in the disclosure, an enlarged depletion region can be extended along the line 33 between the first-type and the second-type semiconductor regions 321, 322, and uniform electric lines of force can be produced in the edge termination portion 32.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A power semiconductor device, comprising:
   a substrate;
   a main body including an active portion that is disposed on said substrate, an edge termination portion that is disposed on said substrate and that surrounds said active portion, and an insulating layer that is disposed on said edge termination portion and spaced apart from said substrate, said edge termination portion including a first-type semiconductor region, a second-type semiconductor region, and a top surface that is formed on top of said first-type and second-type semiconductor regions and that underlies said insulating layer, said first-type semiconductor region being disposed adjacent to said active portion, and having a first-type doping concentration that is decreased from said top surface toward said substrate, said first-type semiconductor region and said second-type semiconductor region cooperatively forming a junction;
   an electrode unit including a first electrode that is disposed on said insulating layer and that is electrically coupled to said active region, and a second electrode that is disposed on said substrate and that is spaced apart from said main body, and
   wherein said substrate has a top surface, said first-type semiconductor region of said edge termination portion extending from said top surface of said edge termination portion toward said substrate and surrounding said active region, said second-type semiconductor region of said edge termination portion extending from said top surface of said substrate to said top surface of said edge termination portion and surrounding said first-type semiconductor region.

2. The power semiconductor device of claim 1, wherein said active region includes a plurality of transistors that are electrically connected in parallel, said first electrode of said electrode unit being coupled to said transistors.

3. The power semiconductor device of claim 1, wherein said active region includes a plurality of rectifiers that are electrically connected in parallel, said first electrode of said electrode unit being coupled to said rectifiers.

4. The power semiconductor device of claim 1, wherein the first-type doping concentration of said first-type semiconductor region is decreased from a part of said edge termination portion, which is proximal to said active portion and said top surface of said edge termination portion, toward said substrate and an outer peripheral surface of said edge termination portion along radial directions that are centered at a point in said part.

5. The power semiconductor device of claim 1, wherein the first-type doping concentration of said first-type semiconductor region is decreased along a first direction that extends from said top surface of said edge termination portion toward said substrate and that is perpendicular to said substrate.

6. The power semiconductor device of claim 5, wherein the first-type doping concentration of said first-type semiconductor region is further decreased along a second direction that extends from said active portion toward an outer peripheral surface of said edge termination portion and that is parallel to said substrate.

7. The power semiconductor device of claim 5, wherein said first-type semiconductor region of said edge termination portion includes N rows of semiconductor segments that are aligned in the second direction, N being greater than 1, each two adjacent ones of said semiconductor segments in said N rows having a first-type doping concentration difference less than 50% based on a first-type doping concentration of one of said two adjacent ones of said semiconductor segments in said N rows.

8. The power semiconductor device of claim 5, wherein said first-type semiconductor region of said edge termination portion includes M rows of semiconductor segments that are aligned in the first direction, M being greater than 1, each two adjacent ones of said semiconductor segments in said M rows having a first-type doping concentration difference less than 50% based on a first-type doping concentration of one of said two adjacent ones of said semiconductor segments in said M rows.

9. The power semiconductor device of claim 5, wherein said first-type semiconductor region of said edge termination portion includes N rows of semiconductor segments that are aligned in the second direction, and M rows of semiconductor segments that are aligned in the first direction, N being greater than 1, M being greater than 1, said semiconductor segments in said N rows being connected to each other, said semiconductor segments in said M rows being connected to each other.

10. The power semiconductor device of claim 5, wherein said first-type semiconductor region of said edge termination portion includes N rows of semiconductor segments that are aligned in the second direction and M rows of semiconductor segments that are aligned in the first direction, N being greater than 1, M being greater than 1, said semiconductor segments in said N rows being connected to each other, said semiconductor segments in said M rows being disconnected from each other.

11. The power semiconductor device of claim 1, wherein the first-type doping concentration of said first-type semiconductor region is decreased from a part of said edge termination portion that is proximal to said top surface of said edge termination portion and said active region toward said substrate and an outer peripheral surface of said edge termination portion, said second-type semiconductor region having a second-type doping concentration that is increased along a first direction that extends from said top surface of said edge termination portion toward said substrate and that is perpendicular to said substrate.

12. The power semiconductor device of claim 11, wherein the second-type doping concentration of said second-type semiconductor region is further increased along a second direction that extends from said active portion toward an outer peripheral surface of said edge termination portion and that is parallel to said substrate.

13. The power semiconductor device of claim 1, wherein said substrate is made of an n-type semiconductor material.

14. The power semiconductor device of claim 1, wherein said first-type is p-type, and said second-type is n-type.

15. The power semiconductor device of claim 1, wherein said first-type is n-type, and said second-type is p-type.

16. The power semiconductor device of claim 1, wherein said edge termination portion further includes a guard-ring section including a guard-ring electrode that is disposed on said insulating layer.

17. The power semiconductor device of claim 16, wherein said guard-ring section further includes a guard-ring semiconductor part that is made of said second-type semiconductor material and that is formed on the top of said first-type semiconductor region, said guard-ring electrode passing through insulating layer and contacting said guard-ring semiconductor part.

18. The power semiconductor device of claim 1, wherein said edge termination portion further includes a guard-ring section including a guard-ring semiconductor part that is made of said second-type semiconductor material and that is formed on the top of said first-type semiconductor region, and that is formed on the part of the edge termination portion which is proximal to the active portion.

* * * * *